(12) United States Patent
Adam et al.

(10) Patent No.: US 6,675,117 B2
(45) Date of Patent: Jan. 6, 2004

(54) CALIBRATING SINGLE ENDED CHANNELS FOR DIFFERENTIAL PERFORMANCE

(75) Inventors: Sean P. Adam, Wrentham, MA (US); William J. Bowhers, Wayland, MA (US)

(73) Assignee: Teradyne, Inc., Boston, MA (US)

(*) Notice: Subject to any disclaimer, the term of this patent is extended or adjusted under 35 U.S.C. 154(b) by 148 days.

(21) Appl. No.: 09/735,261

(22) Filed: Dec. 12, 2000

(65) Prior Publication Data

US 2002/0072870 A1 Jun. 13, 2002

(51) Int. Cl.[7] .............................................. G06F 19/00
(52) U.S. Cl. ...................... 702/106; 702/89; 702/106; 702/117; 702/124; 324/600; 324/601; 324/605; 324/617; 714/700; 713/503; 327/3
(58) Field of Search .............................. 702/85, 89, 90, 702/104, 116, 117, 124, 182, 183, 185, 187, 189, 190, 193, 194; 714/700, 701, 712, 715, 724, 734–736, 738, 740, 741; 324/537, 750, 754, 756, 759, 763, 765, 555, 600, 601, 602, 605, 606; 327/3, 18, 20, 31, 33, 34, 36, 37, 40, 41

(56) References Cited

U.S. PATENT DOCUMENTS

| | | | |
|---|---|---|---|
| 4,660,197 A | 4/1987 | Wrinn et al. | 371/1 |
| 5,058,087 A | 10/1991 | Welzhofer et al. | 368/113 |
| 5,661,427 A | 8/1997 | McBride et al. | 327/236 |
| 5,905,967 A | 5/1999 | Botham | 702/118 |
| 5,982,827 A | 11/1999 | Duffner et al. | 375/354 |
| 6,052,810 A * | 4/2000 | Creek | 714/740 |
| 6,133,725 A | 10/2000 | Bowhers | 324/158.1 |
| 6,281,699 B1 * | 8/2001 | Bishop | 324/765 |

FOREIGN PATENT DOCUMENTS

EP 0390562 10/1990 ............ H03K/4/00

OTHER PUBLICATIONS

U.S. patent application Ser. No. 09/427433, Hauptman et al., filed Oct. 26, 1999.

* cited by examiner

Primary Examiner—Marc S. Hoff
Assistant Examiner—Elias Desta
(74) Attorney, Agent, or Firm—Bruce D. Rubenstein

(57) ABSTRACT

An apparatus and method for deskewing single-ended signals from different driver circuits of an automatic test system provides enough of a reduction in skew to allow differential signals to cross at or near their 50%-points. In accordance with this technique, first and second driver circuits are respectively coupled to first and second inputs of a measurement circuit through pathways having known and preferably equal propagation delays. The first and second driver circuits each generate an edge that propagates toward the DUT, and reflects back when it reaches a respective unmatched load at the location of the DUT. In response to the edge and its reflection, the first and second inputs of the measurement circuit each see a first voltage step and a second voltage step. The interval between the first and second voltage steps is then measured for each input of the measurement circuit. Variable delay circuits disposed in series with the driver circuits are adjusted in response to the measured intervals, to ensure that signals from the first and second driver circuits arrive at the DUT at substantially the same time. The measurement circuit may also measure the slew rates of the signals from the first and second driver circuits. Slew rate adjustment circuits provided with the driver circuits are then adjusted to substantially equalize slew rates from the first and second driver circuits.

23 Claims, 3 Drawing Sheets

CALIBRATING SINGLE ENDED CHANNELS FOR DIFFERENTIAL PERFORMANCE

This invention relates generally to automatic test equipment for electronics. More particularly, this invention relates to deskewing pairs of single-ended signals so that they can be used as differential signals for testing differential components.

BACKGROUND OF THE INVENTION

Automatic test equipment (ATE) plays a significant role in the manufacture of semiconductor devices. Manufacturers generally use automatic test equipment—or "testers"—to verify the operation of semiconductor devices at the wafer and packaged device stages of the manufacturing process. Manufacturers also use ATE to grade devices for various specifications, for example, speed. Parts can then be labeled and sold according to their tested levels of performance.

FIG. 1 illustrates a highly simplified ATE system. As shown in FIG. 1, a host computer 118 runs a test program for testing a DUT 122 via a plurality of pin electronics channels, shown generally as channels 110a–110e. The pin electronics channels each have an I/O terminal (120a–120e) for connecting each respective channel to the DUT 122. Each pin electronics channel typically includes a driver circuit 112, a detector circuit 114, and channel overhead circuitry 116.

The channel overhead circuitry 116 performs numerous functions. It generally includes DACs (digital-to-analog converters) for establishing drive levels for the driver circuit 112, and DACs for establishing threshold levels for the detector circuit 114. It also controls the driver circuit 112 to apply signal edges at precisely controlled instants in time, and controls the detector circuit 114 to sample input signals at precisely controlled instants in time. The channel overhead circuitry 116 includes memory for storing digital vectors to be applied to the DUT by the driver circuit 112 and for storing digital states sampled by the detector circuit 114.

ATE systems have customarily focused on generating single-ended signals accurately. We have recognized, however, that there is also a need for generating differential signals accurately. In contrast with single-ended signals, which convey digital logic by providing one signal referenced to ground, differential signals convey digital logic as differences between two complementary signals, neither of which is ground.

ATE systems have customarily used single-ended hardware for generating differential signals. According to this technique, test systems have employed pairs of drivers to produce single-ended signals that vary as complements of each other. In order to provide timing signals of sufficient accuracy, the single-ended signals must be made to cross each other at or near their respective 50%-points, at the location where they are applied to the DUT. To meet these requirements, a tester must tightly control timing skew.

Conventional test systems have employed processes for reducing timing skew between single-ended channels. These processes have generally involved adjusting variable delay lines to make different driver signals arrive at nodes of the DUT at substantially the same time. One example of these processes is disclosed in U.S. Pat. No. 4,660,197, entitled "Circuitry for synchronizing a multiple channel circuit tester," assigned to Teradyne, Inc., of Boston, Mass.

We have recognized that conventional processes for reducing skew (or "deskewing") suffer from small but significant errors. For example, conventional deskewing processes employ a channel's detector for measuring the delay of the channel's corresponding driver. We have found that small differences in threshold levels between different detectors introduce timing errors that affect deskewing accuracy. Because driver edges have finite slew rates, errors in threshold levels translate into timing errors, causing the detectors to misreport the time at which driver edges occur.

In addition, detector circuits themselves have skew. Although most test systems provide processes for deskewing detectors, skew remaining between detectors adds to driver skew and thus degrades driver accuracy. The combination of these errors may be too great to ensure that differential signals generated by the drivers cross at or near their 50%-points.

SUMMARY OF THE INVENTION

With the foregoing background in mind, it is an object of the invention to reduce timing skew between single-ended signals used to generate differential signals more accurately than is possible using conventional techniques.

To achieve the foregoing object and other objectives and advantages, a measurement circuit is coupled to the outputs of first and second driver circuits. The measurement circuit has a first input coupled to the output of the first driver circuit and a second input coupled to the output of the second driver circuit. Each of the first and second driver circuits is made to generate an edge. The edges from the drivers propagate toward non-terminated loads at the DUT and to the measurement circuit, where they cause the first and second inputs of the measurement circuit to each undergo a first voltage step. When the edges encounter their respective non-terminated loads at the DUT, they reflect back toward the measurement circuit, where they cause the first and second inputs to each undergo a second voltage step. The time difference between the first and second voltage steps is then measured for both inputs of the measurement circuit. In response to the time differences, a delay of at least one of the first and second driver circuits is adjusted to substantially equalize the arrival times of edges from the first and second driver circuits to the DUT. Because one circuit (i.e., the measurement circuit) measures the delay from both drivers, errors associated with using two detector circuits are eliminated and more accurate results are obtained.

BRIEF DESCRIPTION OF THE DRAWINGS

Additional objects, advantages, and novel features of the invention will become apparent from a consideration of the ensuing description and drawings, in which.

DESCRIPTION OF THE PREFERRED EMBODIMENT

Topology

Figure 1:
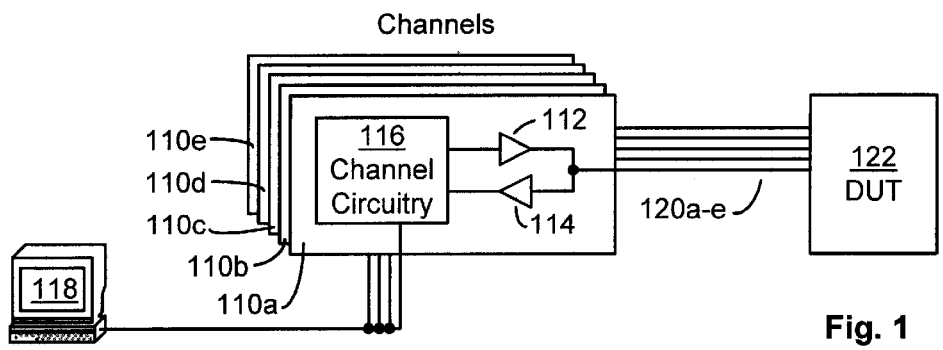
FIG. 1 is a simplified, partial block diagram of a conventional ATE system.
Figure 2:
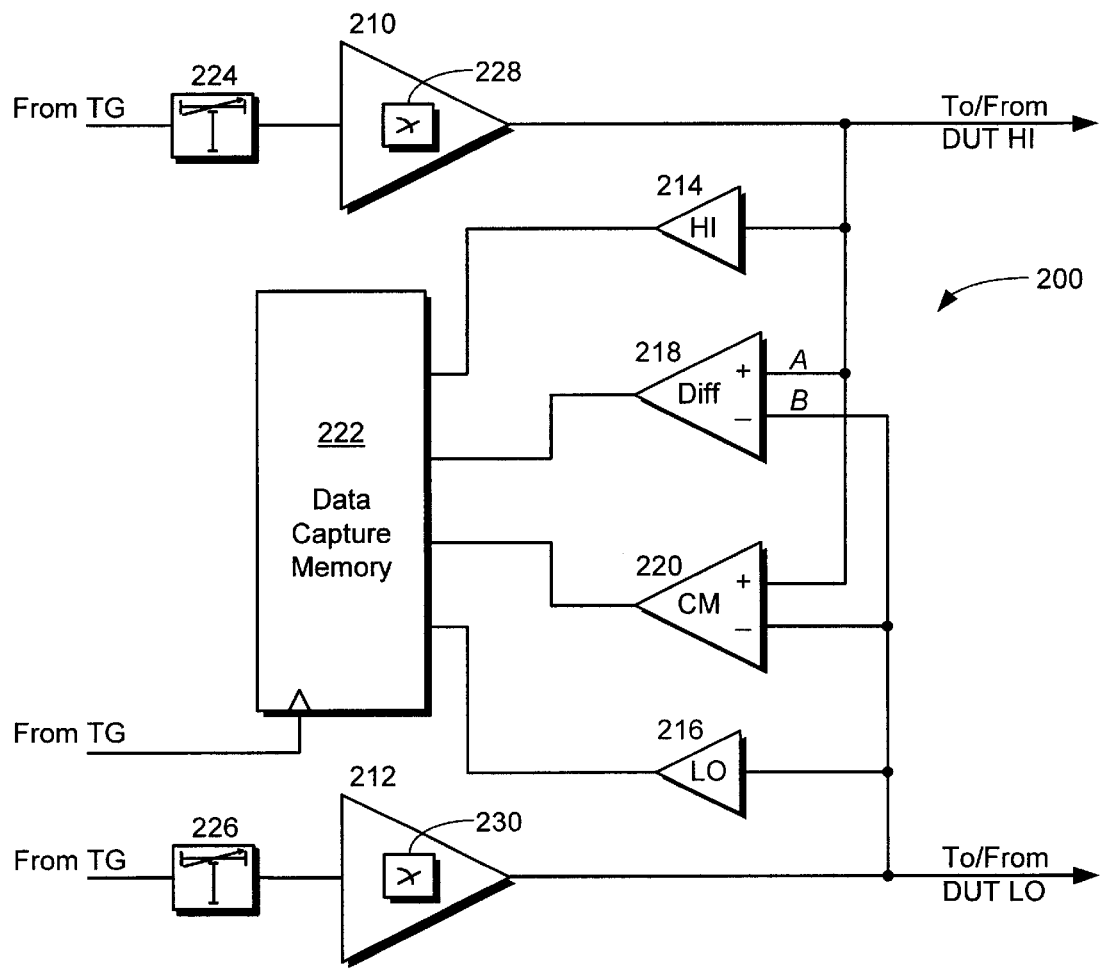
FIG. 2 is a simplified, partial block diagram of a digital channel with which the invention may be practiced.

FIG. 2 illustrates the topology of a digital channel 200 for automatic test equipment constructed in accordance with the invention. As shown in FIG. 2, first and second drivers 210 and 212 provide single-ended output signals through respective transmission paths to first and second nodes of a DUT, labeled DUT HI and DUT LO. The DUT of FIG. 2 is analogous to the DUT 122 of FIG. 1, and the transmission paths of FIG. 2 are analogous to the signal paths 120a–120e of FIG. 1.

Variable delay circuits 224 and 226 delay the passage of signals from the first and second drivers 210 and 212 to the DUT. In addition, variable slew rate circuits 228 and 230 alter the slew rates of drive signals produced by the driver circuits. For accurately deskewing signals from the drivers 210 and 212, both their slew rates and their delays to the DUT should preferably be matched.

As shown in FIG. 2, the digital channel 200 includes first and second single-ended comparators 214 and 216. These comparators have inputs that are respectively coupled to the outputs of the drivers 210 and 212. Preferably, the comparators 214 and 216 provide two programmable thresholds each, and thus act as conventional window comparators.

FIG. 2 also illustrates a differential comparator 218. The differential comparator 218 compares the difference between two input signals (labeled "A" and "B") with two predetermined thresholds to generate output signals. The output signals indicate the relative values of the difference between signals A and B with respect to the thresholds. The differential comparator 218 thus behaves in a manner analogous to a conventional analog differential amplifier followed by a conventional window comparator. The differential comparator operates substantially independently of the common-mode voltage at its inputs.

The differential comparator 218 preferably includes a latch for holding its output state constant upon the issuance of a programmable timing signal. The location of the timing signal can be varied to inspect the differential signal at different instants in time. The test system stores latched outputs from the differential comparator 218 in the data capture memory 222, where it is available to be read by a test program.

FIG. 2 also illustrates a common-mode comparator 220. This comparator is similar to one disclosed in U.S. patent application Ser. No. 09/525,557, entitled "Detector With Common Mode Comparator For Automatic Test Equipment," which is hereby incorporated by reference.

Like the differential comparator 218, the common mode comparator receives the input signals A and B from the drivers 210 and 212. Instead of monitoring their difference, the common-mode comparator 220 monitors their common-mode or average value. The common-mode comparator 220 compares the average value of the signals A and B with programmable thresholds to generate output signals. The common-mode comparator 220 thus behaves analogously to a conventional averaging circuit coupled to a conventional window comparator.

The circuit illustrated in FIG. 2 is preferably fabricated within a single Application Specific Integrated Circuit (ASIC). Other implementations can be used, including multiple ASICs and discrete components. Within the implemented circuit, propagation delays between the drivers 210 and 212 and the inputs (A and B) of the differential comparator 218 are preferably matched. Similarly, the propagation delays between the drivers and the inputs of the common-mode comparator 220 are preferably matched.

Operation

Figure 3:
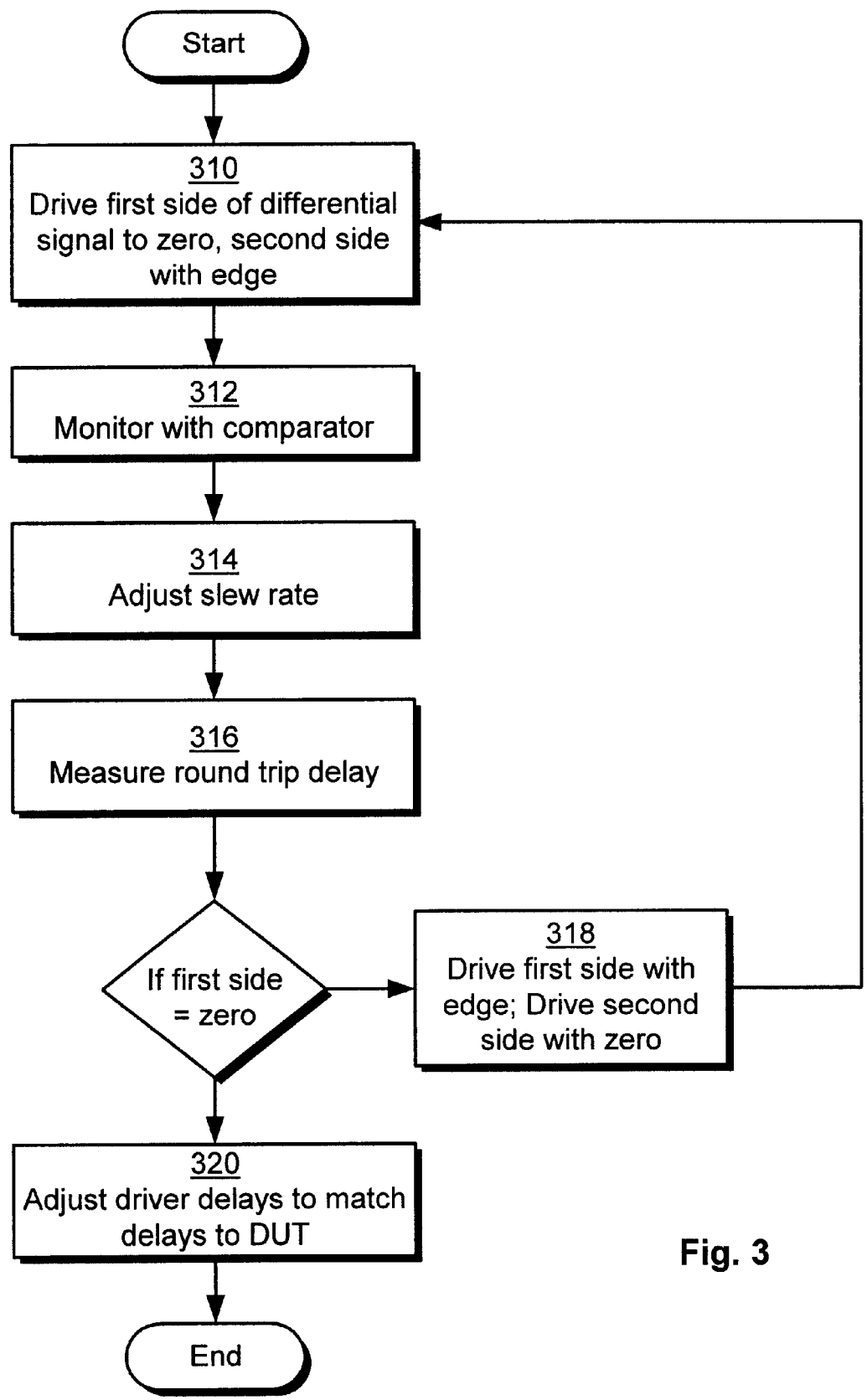
FIG. 3 is a flow chart that shows a process for deskewing driver circuits for differential applications according to the invention.

FIG. 3 illustrates a process according to the invention for reducing timing skew between two drivers, such as the drivers in FIG. 2. In accordance with this process, a test system employs a measurement circuit, such as the differential comparator 218, to determine the difference in propagation delay between each of the drivers and the DUT. In response to the measured difference in delay, at least one of the variable delay lines 224 and 226 is adjusted to compensate for this difference, thus causing the driver signals to arrive at the DUT at substantially the same time.

Figure 4:
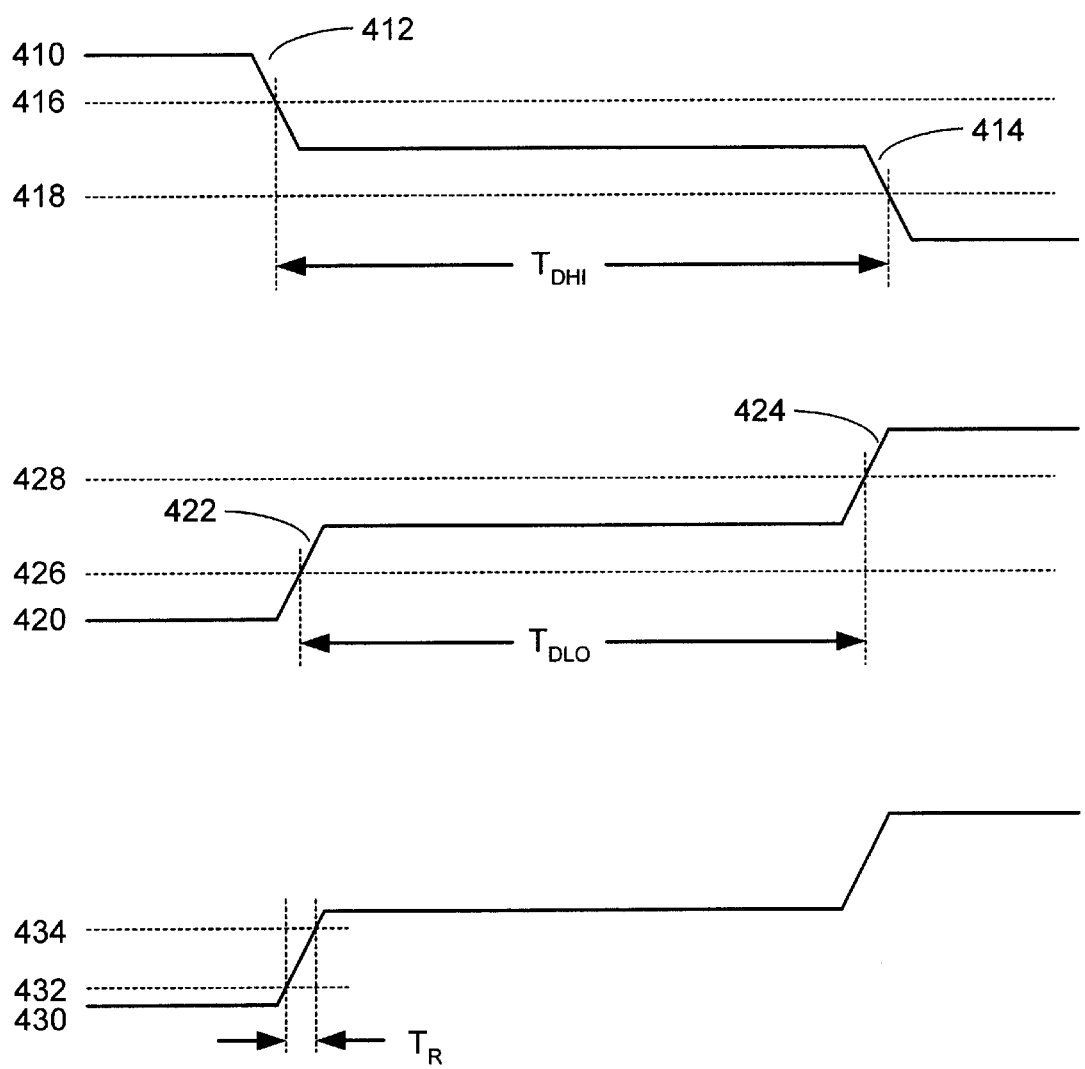
FIG. 4 is a timing diagram that shows various waveforms that are relevant to deskewing driver circuits using the digital channel of FIG. 2.

Beginning at step 310, a first driver, for example the driver 210, produces an edge, while a second driver, for example the driver 212, produces a constant level, such as zero volts. The edge from the first driver 210 propagates toward the DUT; it also propagates to a first input (A) of the differential comparator 218. Waveform 410 of FIG. 4 depicts the signal at the first input of the differential comparator. As shown in FIG. 4, when the edge reaches the first input of the differential comparator, it causes the input to undergo a first voltage step 412.

When the edge reaches the DUT, the edge reflects back through the transmission path toward the source, i.e., back toward the first driver 210. The transition of the edge from the fairly controlled impedance of the transmission path to an open-circuited load causes the edge to roughly double in amplitude. The reflected edge then travels back toward the driver 210 and reaches the input of the differential comparator 218. At this point, the signal at the first input of the differential comparator 218 undergoes a second voltage step 414, roughly doubling the amplitude of the signal.

During this part of the process, the DUT is preferably removed from its test board or socket, so that the load at the location of the DUT is essentially an open circuit. The transmission path preferably has fairly uniform characteristic impedance, for example 50 ohms.

We have recognized that the time interval ($T_{DHI}$) separating the first and second voltage steps 412 and 414 at the first input of the differential comparator approximately equals the round-trip delay between the driver 210 and the DUT terminal. The test system can measure the approximate round trip delay as follows.

The test system sets a threshold of the differential comparator 218 to an expected 50%-point 416 of the first voltage step. For example, if the signal generated by the driver varies between 1V and 0V (prior to doubling), the threshold of the differential comparator is preferably set to the midpoint of this swing, or 0.5 V. Using conventional techniques, the test system then measures the time at which the edge crosses the comparator threshold. This can be done, for example, by varying the time at which the differential comparator 218 is latched while monitoring the output of the comparator, and zeroing in on the time at which the comparator changes state.

Once the system ascertains the time at which the first voltage step occurs, the system adjusts the threshold to a 50%-point 418 of the second voltage step 414. For example, if the reflected signal varies from 0 V to −1 V, the threshold should preferably be set to −0.5 V. Again, using conventional techniques, the test system determines the time at which the reflected waveform crosses this threshold. At step 316, the approximate round trip delay of the driver signal is then computed. The round-trip delay equals the time at which the second step crosses its 50%-point minus the time at which the first step crosses its 50%-point.

The above process is then repeated for the second driver circuit (step 318). For measuring the approximate round-trip delay of the second driver 212, the first driver 210 is held at a constant level, preferably 0 V, and the second driver 212 is driven with an edge. The measurements proceed substantially as described above, except that first and second voltage steps 422 and 424 appear at the second input (B) of the differential comparator 218. Because the second input (B) is an inverting input of the differential comparator, the thresholds 426 and 428 should be adjusted to account for an inversion within the comparator. For instance, assuming the second driver 212 generates a signal that varies between 0 V and 1 V (excluding the reflection), the threshold of the differential comparator 218 should be set to −0.5 V and −1.5 V to capture the first and second voltage steps, respectively.

Significantly, we have recognized that the difference between these two roundtrip delays precisely equals twice the skew between the drivers and the respective terminals of the DUT. But the validity of this relationship depends upon a precise matching of the delay from the first driver 210 to the first input (A) and from the second driver 212 to the second input (B). By design, the circuit 200 is preferably constructed to meet this requirement.

With the skew between the drivers signals as they arrive at the DUT known, the skew can be compensated (step 320) by adjusting the variable delay circuits 224 and 226. For example, if the above measurements show that first driver signal arrives to the DUT earlier than the second, the delay circuit 224 can be programmed to increase its delay. Alternatively, the second delay circuit 226 can be adjusted to decrease its delay, or both delay circuits can be adjusted to apportion the difference in delay.

To obtain the best results from the above technique, the slew rates of the signals generated by the first and second drivers 210 and 212 should also preferably be matched, and the slew rates should be matched before the above process is performed for matching the delays. To measure the slew rate of a signal from a driver, the test system preferably employs the same differential comparator and basic techniques as are described above for measuring delay. A threshold of the differential comparator 218 is first set to the 20%-point of the expected voltage swing (e.g. threshold 432 of waveform 430). Using conventional techniques, the time at which the driver signal crosses this 20% threshold 432 is then determined. The threshold is then moved to the 80%-point 434 of the expected voltage swing, and the 80% crossing time is determined. The interval between the 20% crossing time and the 80% crossing time is proportional to the slew rate of the driver signal. The slew rate of the second driver 212 is then measured using the same technique. Once the slew rates are measured, at least one of the slew rate adjustment circuits 228 and 230 is adjusted to equalize the slew rates of the two signals (step 314).

Advantages

The technique described above provides benefits that are not found in conventional deskewing techniques. Whereas conventional techniques employ separate detector circuits for measuring delays of their corresponding drivers, the technique according to the invention uses a single measurement circuit. Therefore, the instant technique does not suffer from errors in threshold levels between different detector circuits. In addition, since the delays between the drivers and the measurement circuit are preferably matched, there is no need to deskew detectors in order to accurately deskew drivers. Errors in deskewing detectors do not detract from driver accuracy. Because these various errors are eliminated, differential signals generated by the drivers 210 and 212 can be made to cross at or near their 50%-points, and thus to convey their data more reliably. Moreover, because the driver circuits 210 and 212 are inherently single-ended, they can produce deskewed signals that are either single-ended or differential, depending upon the testing needs of the particular device under test.

Alternatives

Having described one embodiment, numerous alternative embodiments or variations can be made. For example, the embodiment described above employs the differential comparator 218 for determining delays and slew rates of the first and second drivers 210 and 212. Alternatively, the common-mode comparator 220 could be used. Rather than operating on the difference between signals from the first and second drivers, the common-mode comparator 220 operates on their average. As yet another alternative, any suitable measurement circuit having at least two inputs that receive the output signals from the drivers could be used.

In the preferred embodiment, separate variable delay circuits and slew rate adjustment circuits are provided for each driver. Alternatively, only one variable delay circuit and one slew rate adjustment circuit is used. Where only one variable delay circuit is used, the variable delay circuit is disposed in series with a first driver, and a fixed delay circuit is added in series with a second driver. The mid-scale delay of the variable delay circuit approximately equals the delay of the fixed delay circuit, so that the variable delay circuit can adjust its delay both positively and negatively with respect to the fixed delay. Similarly, where only one slew rate adjustment circuit is used, the driver without the slew rate adjustment circuit has a slew rate that is slower than the maximum slew rate of the other driver. The slew rate adjustment circuit of the other driver can then be varied to equalize the slew rates of the two drivers.

The embodiment described above proceeds in a particular order: the delay of the first driver 210 is measured; then the delay of the second driver 212 is measured. As readily known to those skilled in the art, this order is arbitrary and can be reversed.

Similarly, the first driver 210 is shown above as generating a falling edge for the purpose of measuring its round-trip delay, and the second driver 212 is shown generating a rising edge. This also could be reversed. Alternatively, both rising and falling edges could be generated and measured for both drivers.

In the embodiment disclosed above, the technique for correcting skew does not distinguish between rising and falling edges. In some instances, it is desirable to correct rising and falling edges separately. Therefore, according to another alternative, roundtrip delays are measured for each driver for both rising and falling edges. Different delays are then established in the variable delay circuits 224 and 226, depending on whether a rising or falling edge is to be produced.

Similarly, the technique disclosed above does not distinguish between rising and falling edges in correcting for slew rate. Alternatively, slew rates can be measured for both rising and falling edges, and separate corrections can be provided for generating rising and falling edges.

As described above, slew rates are measured using the differential comparator 218. This is chosen for simplicity and enhanced accuracy, but it is not required. Slew rate is a characteristic of an individual signal-not a characteristic between signals. Thus, it can be measured by the single ended comparators 214 and 216, or, for that matter, by the common-mode comparator 220. In addition, slew rate is determined above by measuring a voltage step at its 20%-point and 80%-point. The points at which these measurements are made can be varied as situations vary, to obtain the best results under the circumstances.

In the technique described above, a single threshold circuit is used to measure the round-trip delay of each driver. First, the threshold circuit places a threshold at the midpoint of a first voltage step; then, it moves the threshold to the midpoint of a second voltage step. It is believed that using a single threshold circuit provides greater accuracy than using two different threshold circuits. However, the invention should not be construed as being limited to use with a single threshold circuit.

The midpoint of an edge is a convenient point for determining the timing of an edge, and thus for measuring round-trip time of the driver signals. Other points—or groups of points—can be used, however, provided that the point or points are used in a consistent manner that does not distort the measurement results.

As describe above, the DUT is generally removed before measuring the round-trip delays of the drivers. Removing the DUT causes the driver signals to see open-circuited loads when they reach the location where the DUT is generally installed. If the input impedance of the DUT is high enough, however, the DUT can remain connected during these measurements, with the same results.

As an alternative to providing an open-circuited load, any unmatched load can be used, i.e., any load that does not terminate the transmission path in its characteristic impedance. For example, a short-circuited load to ground can be used. Rather than causing the driver signal to double in amplitude, the short-circuited load would cause it to return to zero. The technique described above would then be adapted to measure the time interval between the two voltage steps that would result from this arrangement.

In addition, the preferred embodiment provides that electrical delays between the drivers and the inputs to the measurement circuit be matched. Although preferable, this is not required. The technique described above can be used with unmatched delays, provided that they are known. According to this variation, the delays established in the programmable delays can be offset to compensate for the skew between the drivers and the inputs of the measurement circuit, without requiring that the delays be strictly matched.

Each of these alternatives and variations, as well as others, has been contemplated by the inventor and is intended to fall within the scope of the instant invention. It should be understood, therefore, that the foregoing description is by way of example, and the invention should be limited only by the spirit and scope of the appended claims.

What is claimed is:

1. A method of deskewing first and second driver circuits for generating a differential signal with relatively little timing skew between its constituent components, comprising:
   (A) generating, from each of the first and second driver circuits, an edge that propagates to a respective unmatched load;
   (B) receiving the edge from the first driver circuit at a first input of a measurement circuit and the edge from the second driver circuit at a second input of the measurement circuit, each edge inducing a first voltage step responsive to the step A and a second voltage step responsive to a reflection of the edge from the respective unmatched load; and
   (C) measuring a time difference between the first and second voltage steps for each of the first and second inputs of the measurement circuit.

2. A method as recited in claim 1, further comprising:
   (D) adjusting, responsive to the time differences measured in step C, a delay of edges generated by at least one of the first and second driver circuits so that edges from the first and second driver circuits arrive a device under test at substantially the same time.

3. A method as recited in claim 2, further comprising generating a substantially deskewed differential signal from the first and second driver circuits.

4. A method as recited in claim 3, further comprising:
   applying the substantially deskewed differential signal to a differential input of the device under test; and
   testing the device under test using the substantially deskewed differential signal.

5. A method as recited in claim 1, wherein the measurement circuit is fabricated within an integrated circuit along with the first and second driver circuits.

6. A method as recited in claim 2, wherein
   the first and second driver circuits each have a propagation delay to the respective input of the measurement circuit, and
   the step of adjusting accounts for propagation delays of the first and second driver circuits to the respective inputs of the measurement circuit.

7. A method as recited in claim 2, wherein
   the first and second driver circuits each have a propagation delay to the respective input of the measurement circuit, and
   the propagation delays between drivers and the respective inputs of the measurement circuit are matched.

8. A method as recited in claim 2, further comprising:
   the measurement circuit generating an output signal that varies in relation with one of a sum of the signals from the first and second driver circuits and a difference between the signals from the first and second driver circuits; and
   comparing the output signal of the measurement circuit with at least one predetermined threshold.

9. A method as recited in claim 8, wherein the second driver circuit produces a steady output signal while the first driver circuit generates the edge from the first driver circuit, and the first driver circuit produces a steady output signal while the second driver circuit generates the edge from the second driver circuit.

10. A method as recited in claim 9, wherein the step C of measuring the time difference between the first and second voltage steps includes measuring a time difference between a 50%-point of the first voltage step and a 50%-point of the second voltage step.

11. A method as recited in claim 1, wherein, prior to the step C of measuring the time difference, the method comprises:
   measuring a slew rate of the first and second edges; and
   adjusting the slew rate of at least one of the first and second edges to substantially equalize the slew rates of the first and second edges.

12. A method as recited in claim 2, wherein the first edge is one of a rising edge and a falling edge, the method further comprising:
   repeating the steps of measuring (C) and adjusting (D) for the other of said rising edge and said falling edge.

13. A method as recited in claim 12, wherein the second edge is one of a rising edge and a falling edge, and the method further comprises repeating the steps of measuring (C) and adjusting (D) for the other of said rising edge and said falling edge.

14. A method as recited in claim 1, wherein the measurement circuit includes a differential amplifier wherein the first input is an inverting input and the second input is a non-inverting input.

15. A method as recited in claim 1, wherein the measurement circuit includes a common mode amplifier wherein the first and second inputs are provided for monitoring a common mode voltage of signals from the first and second driver circuits.

16. A method of testing differential devices with automatic test equipment, comprising:
   (A) deskewing a plurality of pairs of single-ended driver circuits;
   (B) applying output signals from the plurality of pairs of single-ended driver circuits to a device under test, wherein the output signals from each pair of single-ended driver circuits constitutes a differential signal; and
   (C) monitoring responses from the device under test, to determine whether the device under test is defective,
   wherein the step (A) of deskewing includes, for each pair of single-ended driver circuits,
      (i) generating, from each of the first and second driver circuits, an edge that propagates to a respective unmatched load;
      (ii) receiving the edge from the first driver circuit at a first input of a measurement circuit and the edge from the second driver circuit at a second input of the measurement circuit, each edge inducing a first voltage step responsive to the step A and a second voltage step responsive to a reflection of the edge from the respective unmatched load; and
      (iii) measuring a time difference between the first and second voltage steps for each of the first and second inputs of the measurement circuit; and
      (iv) adjusting, responsive to the time differences measured in step iii, a delay of edges generated by at least one of the first and second driver circuits so that edges from the first and second driver circuits arrive at the first and second locations of the device under test at substantially the same time.

17. In an automatic test system, an apparatus for deskewing driver circuits for testing devices under test having differential inputs, comprising:
   a first driver circuit having an output suitable for providing a first single-ended signal to a device under test;
   a second driver circuit having an output suitable for providing a second single-ended signal to the device under test;
   a variable delay circuit coupled substantially in series with the first driver circuit for delaying the propagation of edges of the first driver circuit to the device under test; and
   a measurement circuit having a first input coupled to the output of the first driver circuit and a second input coupled to the output of the second driver circuit;
   wherein the variable delay circuit is adjustable in response to an output signal from the measurement circuit to substantially equalize arrival times of the first and second single-ended signals to the device under test.

18. An apparatus as recited in claim 17, wherein the first and second driver circuits are coupled to the first and second inputs of the measurement circuit via conduction paths that have substantially equal propagation delays.

19. An apparatus as recited in claim 17, wherein the variable delay circuit is a first variable delay circuit, and further comprising:
   a second variable delay circuit coupled substantially in series with the second driver circuit for delaying the propagation of edges of the second driver circuit to the device under test,
   wherein the second variable delay circuit is adjustable in response to an output signal from the measurement circuit to substantially equalize arrival times of the first and second single-ended signals to the device under test.

20. An apparatus as recited in claim 17, further comprising at least one slew rate adjustment circuit coupled to the output of at least one of the first and second driver circuits,
   wherein the at least one adjustable slew rate circuit is adjustable in response to values stored in the data capture memory to substantially equalize slew rates of the first and second single-ended signals.

21. An apparatus as recited in claim 17, wherein the measurement circuit includes one of a differential comparator and a common-mode comparator.

22. An apparatus as recited in claim 21, wherein the measurement circuit comprises a comparator for comparing one of a sum of and a difference between the signal levels at the first and second inputs of the measurement circuit with at least one predetermined threshold.

23. An apparatus as recited in claim 22, further comprising a data capture circuit coupled to the comparator and being operable to capture an output state of the comparator at a predetermined instant of time.

* * * * *